(12) United States Patent
     Carmichael et al.

(10) Patent No.: US 6,308,311 B1
(45) Date of Patent: Oct. 23, 2001

(54) METHOD FOR RECONFIGURING A FIELD PROGRAMMABLE GATE ARRAY FROM A HOST

(75) Inventors: Carl H. Carmichael, Campbell; Conrad A. Theron, San Jose, both of CA (US); Donald H. St. Pierre, Jr., Nashua, NH (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/311,627

(22) Filed: May 14, 1999

(51) Int. Cl.[7] .................................................. G06F 17/50
(52) U.S. Cl. ................................................................ 716/16
(58) Field of Search ................................................. 716/16

(56) References Cited

U.S. PATENT DOCUMENTS

| | | | |
|---|---|---|---|
| Re. 34,363 | 8/1993 | Freeman | 326/38 |
| 5,430,687 | 7/1995 | Hung et al. | 365/230.08 |
| 5,844,829 | 12/1998 | Freidin et al. | 708/232 |
| 6,118,938 | * 9/2000 | Lawman et al. | 716/16 |

OTHER PUBLICATIONS

The Programmable Logic Data Book, published 1998 by Xilinx, Inc.

* cited by examiner

Primary Examiner—Trong Phan
(74) Attorney, Agent, or Firm—William L. Paradice; Edel M. Young

(57) ABSTRACT

A method is disclosed for reconfiguring an on-board FPGA of an interface device without resetting the interface device. The FPGA interface device also includes a microcontroller, and the on-board FPGA has a serial data port coupled to a first, non-volatile memory and a parallel data port coupled to a second memory, which may be a volatile memory. The default configuration design is stored in the non-volatile memory. The on-board FPGA is initially in a serial configuration mode such that upon power-up, the on-board FPGA looks to the first memory via its serial port for the configuration design. Where it is desired to reconfigure the on-board FPGA, a new configuration design is stored in the second memory, and the on-board FPGA is instructed to reconfigure itself in parallel mode. In response thereto, the on-board FPGA looks to the second memory via its parallel port, retrieves the new configuration design, and then reconfigures itself accordingly.

6 Claims, 11 Drawing Sheets

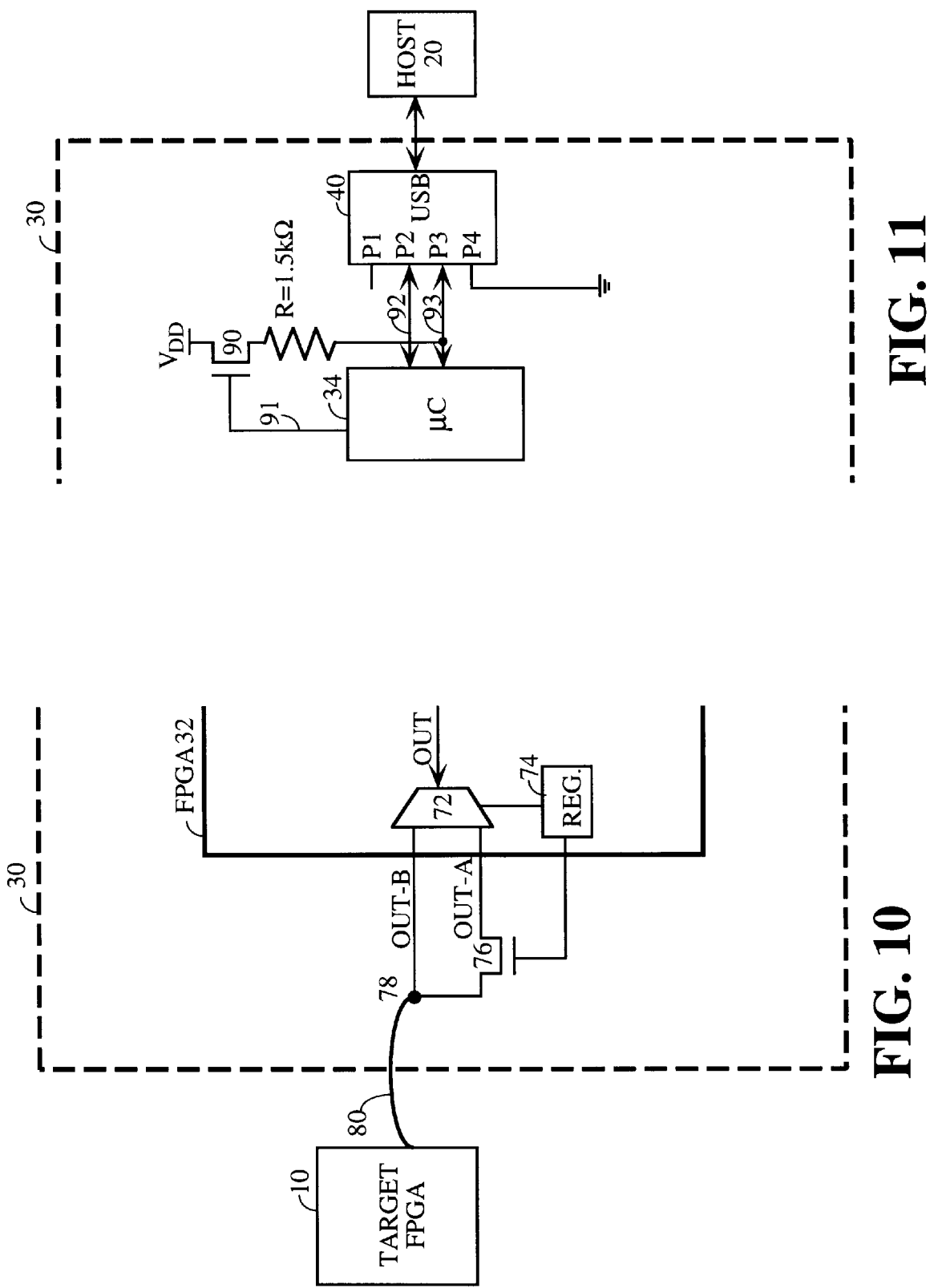

METHOD FOR RECONFIGURING A FIELD PROGRAMMABLE GATE ARRAY FROM A HOST

CROSS-REFERENCES TO RELATED APPLICATIONS

This application relates to the following commonly owned U. S. Patent Applications, all filed on the same day as this application, and all incorporated herein by reference:

Ser. No. 09/312,316, entitled "METHOD FOR RESETTING AN FPGA INTERFACE DEVICE" invented by Conrad A. Theron and Donald H. St. Pierre, Jr., Ser. No. 09/312,282, entitled "EMBEDDING FIRMWARE FOR A MICROPROCESSOR WITH CONFIGURATION DATA FOR A FIELD PROGRAMMABLE GATE ARRAY" invented by Edwin W. Resler, Conrad A. Theron, Donald H. St. Pierre, Jr., and Carl H. Carmichael, Ser. No. 09/312,022, entitled "METHOD FOR CHANGING EXECUTION CODE FOR A MICROCONTROLLER ON AN FPGA INTERFACE DEVICE" invented by Conrad A. Theron, and Donald H. St. Pierre, Jr., Ser. No. 09/312,001, entitled "METHOD FOR DETECTING LOW POWER ON AN FPGA INTERFACE DEVICE" invented by Conrad A. Theron, Edwin W. Resler, and Donald H. St. Pierre, Jr., Ser. No. 09/312,023, entitled "METHOD FOR LEVEL SHIFTING LOGIC SIGNAL VOLTAGE LEVELS" invented by Donald H. St. Pierre, Jr., and Conrad A. Theron, and Ser. No. 09/312,035, entitled "METHOD OF DISGUISING A USB PORT CONNECTION" invented by Donald H. St. Pierre, Jr. and Conrad A. Theron, Ser. No. 09/312,024, entitled "SYSTEM AND METHOD FOR READING DATA FROM A PROGRAMABLE LOGIC DEVICE" invented by Thach-Kinh Le, Chakravarthy K. Allamsetty, Carl H. Carmichael, Arun K. Mandhania, Donald H. St. Pierre, Jr. and Conrad A. Theron, Ser. No. 09/311,628, entitled "SYSTEM AND METHOD FOR TESTING A CIRCUIT IMPLEMENTED ON A PROGRAMMABLE LOGIC DEVICE" invented by Chakravarthy K. Allamsetty.

FIELD OF THE INVENTION

This invention relates generally to programmable devices such as field programmable gate arrays, and specifically to methods for in-system reconfiguration of field programmable gate arrays.

BACKGROUND OF THE INVENTION

FIG. 1 shows a conventional Field Programmable Gate Array (FPGA) 1 having an array of configurable logic blocks (CLBs) 2 surrounded by input/output blocks (IOBs) 3. The CLBs 2 are individually programmable and can be configured to perform a variety of logic functions ranging from simple AND gates to more complex functions of a few input signals. A programmable interconnect structure 4 includes a matrix of programmable switches (PSMs) 5 which can be programmed to selectively route signals between the various CLBs 2 and IOBs 3 and thus produce more complex functions of many input signals. The IOBs 3 can be configured to drive output signals from the CLBs 2 to external pins (not shown) of FPGA 1 and/or to receive input signals from the external FPGA pins.

The CLBs 2, IOBs 3, and PSMs 5 of FPGA 1 are programmed by loading configuration data into memory cells (not shown for simplicity) connected to CLBs 2, IOBs 3, and PSMs 5. These memory cells control various switches and multiplexers within respective CLBs 2, IOBs 3, and PSMs 5 which implement logic and routing functions specified by the configuration data in the memory cells. Configuration data is provided to FPGA 1 via a configuration port 6 and thereafter routed to the memory cells using a dedicated configuration structure (not shown here but described in U.S. Pat. Nos. Re. 34,363, 5,430,687, 5,742,531, and 5,844, 829). Configuration port 6 is connected to the dedicated configuration structure by a configuration access port (CAP) 7, which is essentially a bus access point. Further information regarding various types of FPGAs can be found in "The Programmable Logic Data Book 1998", published in 1998 by Xilinx, Inc., and available from Xilinx, Inc., 2100 Logic Drive, San Jose, Calif. 95124.

Configuration data is typically downloaded to an FPGA from a host system such as a personal computer or workstation using an FPGA interface cable, as illustrated in FIG. 2. Well known design tool software operating on a suitable microprocessor within host system 20 creates a configuration bitstream which embodies the logic functions desired to be implemented by the target FPGA. The configuration bitstream is downloaded from host system 20 to interface cable 15 using, for instance, a serial port or a USB port. The interface cable 15 preferably includes an on-board FPGA that customizes the configuration bitstream received from the host system 20 into a format usable by target FPGA 10, although in some embodiments host system 20's microprocessor is used to customize the configuration bitstream for target FPGA 10. Since an FPGA is able to customize configuration data at a rate much faster than that of a microprocessor, FPGA interface cables having an on-board FPGA provide superior performance.

Interface cables having an on-board FPGA typically include an associated non-volatile memory for storing the on-board FPGA's default configuration design. When the interface cable is powered up, the on-board FPGA reads its default configuration design from the associated memory, and then configures itself accordingly. Should it become desirable to change or update the configuration of the on-board FPGA, e.g., so as to enable the interface cable to be used with target devices of varying configurations and compatibility standards, the associated memory is re-programmed with the new configuration design. The interface device is then reset. Upon subsequent boot-up of the interface cable, the on-board FPGA reads the new configuration design from the associated memory, and then configures itself accordingly.

Reconfiguring the on-board FPGA by using a different non-volatile memory requires actually removing an IC device from the board and replacing it. This is typically not possible for an end user. Further, resetting the interface cable typically requires the user to manually activate a reset switch on the interface device, which is inconvenient and time consuming. Further, since the entire interface cable is reset in order to reconfigure the on-board FPGA, the microcontroller must also be reset and then booted up again, which undesirably consumes additional time. In addition, since the new configuration design is typically written to the same memory space which stores the default configuration design, the default configuration design is no longer available after reconfiguration of the on-board FPGA. Thus, if a problem develops with the new configuration design, the default configuration design must be re-programmed into the memory, and the interface cable again reset.

SUMMARY OF THE INVENTION

The present invention provides a method for reconfiguring the on-board FPGA of an FPGA interface device. In accordance with the present invention, an FPGA interface device includes a microcontroller and an on-board FPGA having a serial data port coupled to a first, non-volatile memory and a parallel data port coupled to a second memory, which may be a volatile memory. The default configuration design is stored in the non-volatile memory. The on-board FPGA is initially in a serial configuration mode such that upon power-up, the on-board FPGA looks to the first memory via its serial port for the configuration design. Where it is desired to reconfigure the on-board FPGA, a new configuration design is downloaded from a host system to the interface device and thereafter stored in the second memory. Then, the host system instructs the on-board FPGA to reconfigure itself in parallel mode. In response thereto, the on-board FPGA looks to the second memory via its parallel port for the configuration design. The new configuration design is read from the second memory to the on-board FPGA, which then configures itself accordingly. In this manner, present embodiments allow the on-board FPGA to be reconfigured without resetting the interface device, and without having to overwrite the default configuration design.

In order for the microcontroller to load a new configuration into the on-board FPGA, the microcontroller must have access to its firmware code. But if the FPGA is the interface between the microcontroller and the firmware code, reconfiguring the FPGA will disrupt access to this firmware code. According to the present invention, the microcontroller loads the new FPGA configuration into an SRAM accessible to the FPGA, then places the FPGA into parallel load mode. During reconfiguration, the FPGA holds the microcontroller in standby mode while the FPGA is loading its new configuration from the SRAM. When the FPGA has reconfigured itself, it activates the microcontroller, and operation continues with the FPGA in a new configuration.

BRIEF DESCRIPTION OF THE DRAWINGS

FIG. 10 is a schematic diagram of an output configuration in accordance with one embodiment of the present invention; and FIG. 11 is a circuit diagram of a USB port and associated control logic used in accordance with present embodiments.

Like components in the Figures are similarly labeled.

DETAILED DESCRIPTION OF THE INVENTION

Figure 3:
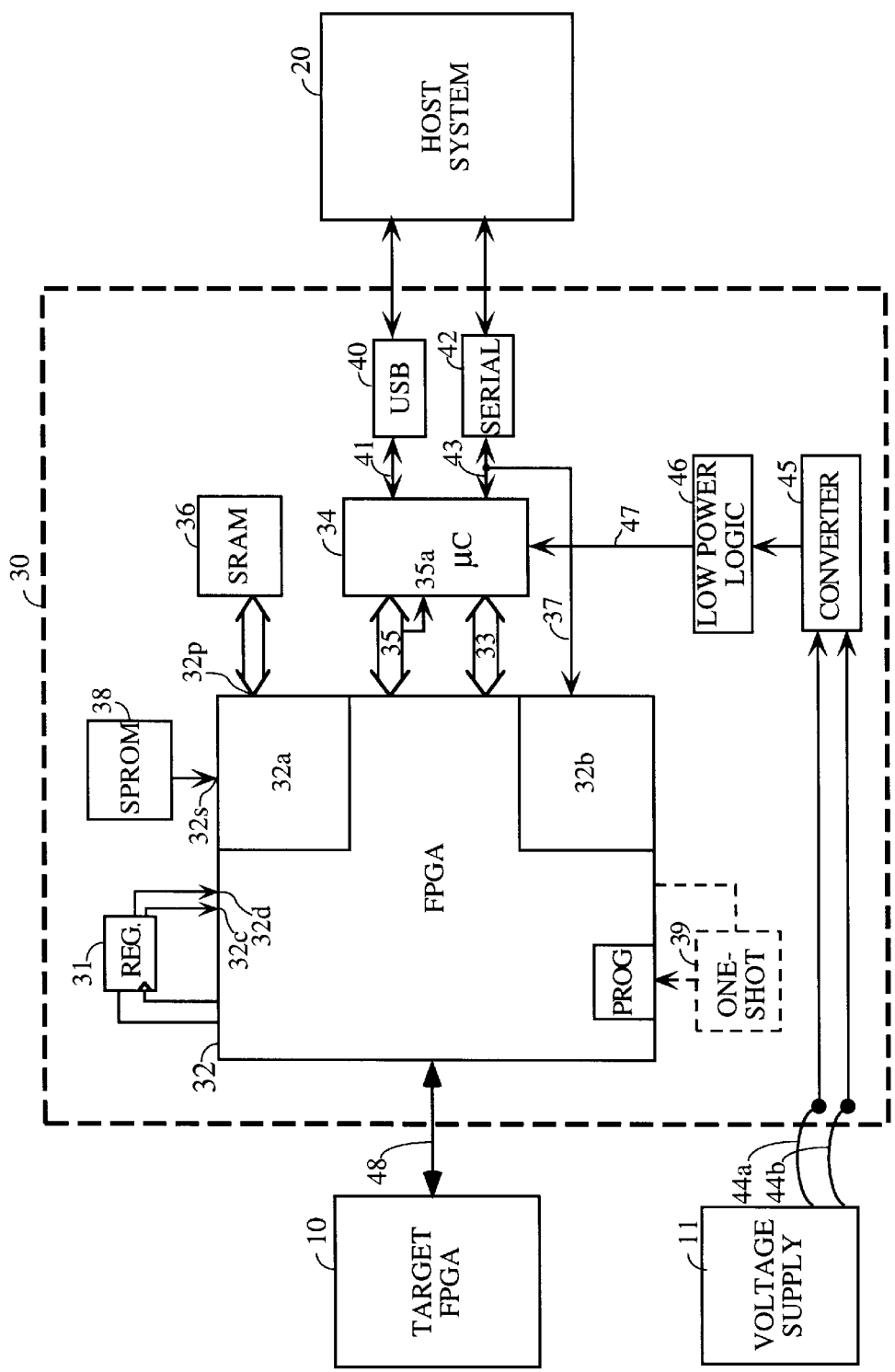
FIG. 3 is a schematic diagram of an FPGA interface device in accordance with the present invention shown coupled between the host system and the target FPGA.

FIG. 3 shows an example system for configuring and/or testing target FPGA 10 from host system 20 using an interface device 30 in accordance with the present invention. Host system 20 is a conventional personal computer or workstation having a microprocessor such as, for instance, a Pentium processor available from Intel Corporation of Santa Clara, Calif. Although shown in FIG. 3 as an FPGA, target device 10 is in some embodiments a chain of FPGAs or PLDs, and may in other embodiments be any other suitable programmable device(s). Further, target device 10 may have any suitable type of input port such as a JTAG-compatible port (set forth in the IEEE Standard 1149.1, "Test Access Port and Boundary Scan Architecture"), although other suitable port configurations may be used, e.g., a serial port, an express port, a peripheral port, synchronous port, asynchronous port, and so on.

Interface device 30 includes an on-board FPGA 32, a microcontroller 34, a static random access memory (SRAM) 36, and a serial programmable read-only memory (SPROM) 38. Interface device 30 also includes a Universal Serial Bus (USB) interface 40 and an RS-232 serial port interface 42, which are coupled to the USB and serial ports, respectively, of host system 20.

On-board FPGA 32 is coupled to receive serial data from SPROM 38 via its serial port 32s, and is coupled to provide data to and receive data from SRAM 36 in a byte-wide parallel format via its parallel port 32p. Data is transferred between on-board FPGA 32 and microcontroller 34 via an address/data bus 33. On-board FPGA 32 and microcontroller 34 each provide control signals to one or more dedicated pins of the other via control lines, shown collectively in FIG. 3 as a bidirectional bus 35, although actual embodiments may employ dedicated control lines. Microcontroller 34 is coupled to USB port 40 via a signal line 41 and to RS-232 serial interface 42 via a signal line 43.

Interface device 30 further includes register 31 for controlling mode pins of FPGA 32, and optionally a one-shot device 39 for resetting FPGA 32.

Interface device 30 receives its supply voltage and ground potential reference from an external voltage supply 11 via flying wires 44a and 44b, respectively. A conventional voltage converter circuit 45 including suitable voltage step-up and step-down circuits and voltage regulators provides suitable voltage planes for interface device 30. In one embodiment, converter circuit 45 provides 5 volt and 3.3 volt power planes. In some embodiments, external voltage supply 11 is located on the circuit board of target FPGA 10 and, in other embodiments, external voltage supply 11 is a dedicated supply external to the circuit boards of both interface device 30 and target 10. A low power detection circuit 46 has an input terminal coupled to a power plane provided by converter circuit 45, and has an output terminal coupled to microcontroller 34 via signal line 47. In one embodiment, low power detection circuit 46 is incorporated into converter 45. In another embodiment, low power detection circuit 46 is formed by configuring a portion of FPGA 32.

Figure 1:
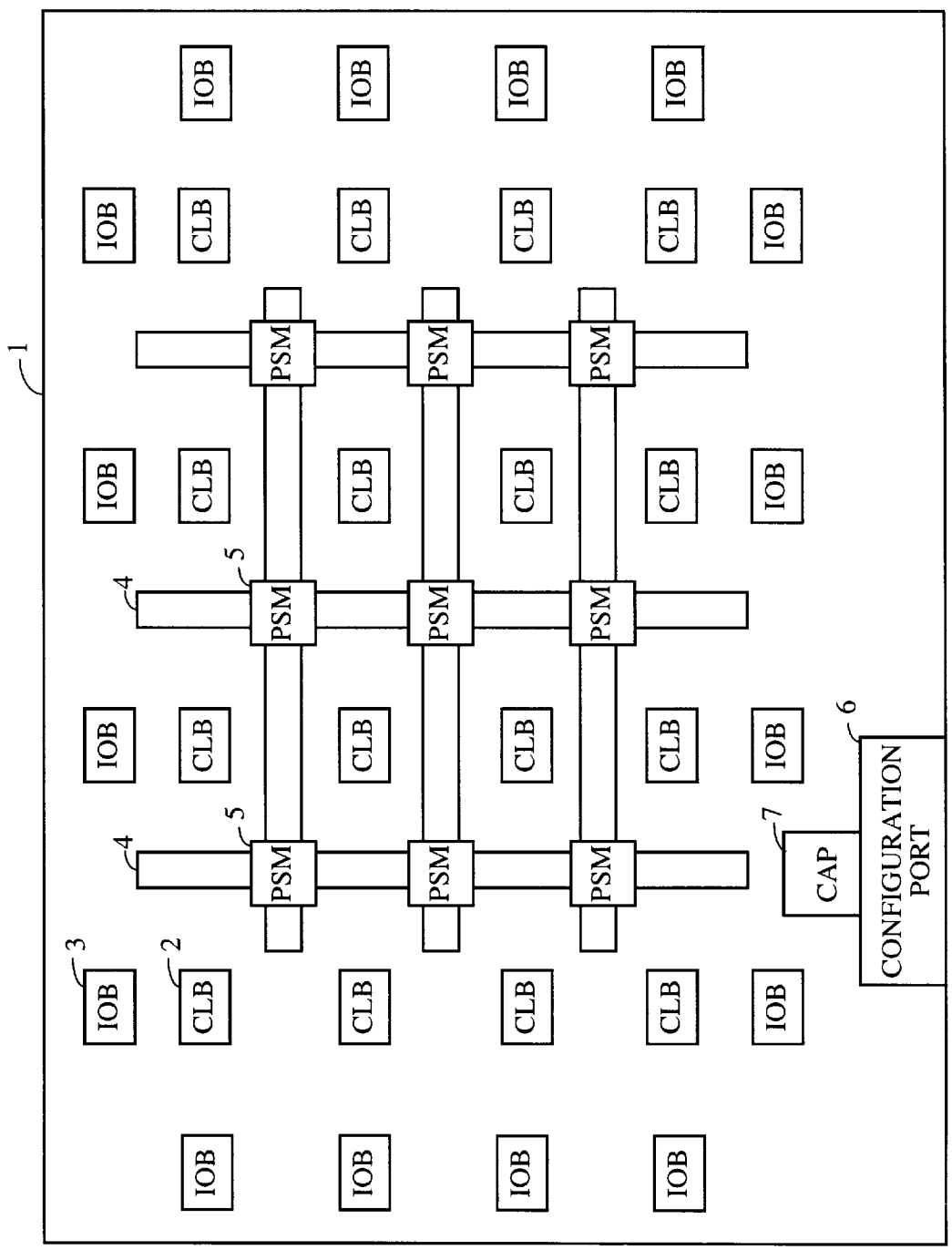
FIG. 1 is a simplified schematic diagram of a conventional FPGA.
Figure 2:
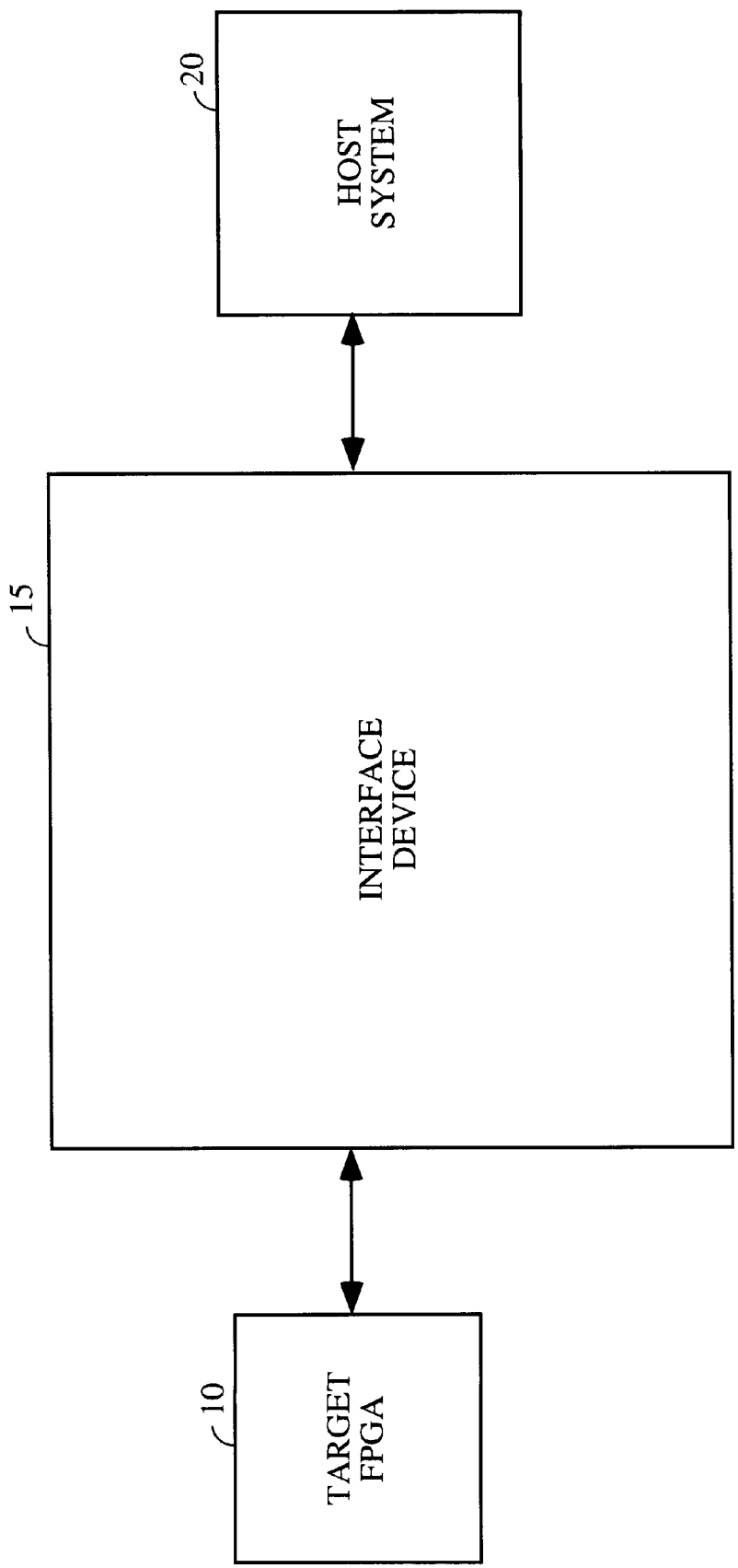
FIG. 2 is a block diagram of an FPGA interface cable coupled between a host system and a target FPGA.

On-board FPGA 32 is generally of the type discussed above with respect to FIG. 1 such as, for instance, a XC4013XL FPGA available from Xilinx, Incorporated, of San Jose, Calif., and may be configured to simultaneously implement multiple logic and routing functions. For instance, the CLBs, IOBs, and PSMs of one portion of on-board FPGA 32 may be configured to implement a first function, while the CLBs, IOBS, and PSMs of another portion of on-board FPGA 32 may be configured to simultaneously implement a second function which is independent from the first function.

In one embodiment, microcontroller 34 is an 80930A microcontroller available from Intel Corporation of Santa Clara, Calif., and SPROM 38 is a XC1701 SPROM available from Xilinx, Incorporated. In some embodiments, SPROM 38 has a surface area less than 0.395 inches by 0.395 inches. Further, although shown in FIG. 3 as one chip, SRAM 36 may in some embodiments be two or more SRAM chips, or may be implemented in part of FPGA 32.

In preferred embodiments, a first portion 32a of on-board FPGA 32 is configured to receive serial data from SPROM 38, parallelize the serial data, and provide the resulting parallel data to SRAM 36 in a byte-wide format, and a second portion 32b of on-board FPGA 32 is configured to monitor data received on serial port 42 via signal line 37. First and second on-board FPGA portions 32a and 32b are independent of one another and independent of the remaining portions of on-board FPGA 32.

Interface device 30 actively interfaces between host system 20 and target FPGA 10 during configuration and/or testing of target FPGA 10. To configure target FPGA 10 to implement one or more desired functions, a well known design tool is used to create a configuration bit file which embodies the one or more desired functions. A well known download software tool operating on host system 20's microprocessor sends the configuration bit file as a configuration bitstream to interface device 30 via USB port connection 40 or serial port connection 42. Microcontroller 34 routes the configuration bitstream via bus 33 to on-board FPGA 32 which, in turn, customizes the configuration data into a format compatible with and optimized for target FPGA 10. The resulting customized configuration data is provided to target FPGA 10 via signal lines 48. In some embodiments, the configuration bitstream is downloaded from host system 20 to interface device 30 in a compressed format, in which case microcontroller 34 uses a suitable well known de-compression technique to de-compress the configuration bitstream. In other embodiments, on-board FPGA 32 is configured to de-compress the configuration bitstream downloaded from host system 20.

In accordance with the present invention, both the default configuration design for on-board FPGA 32 and the default firmware code for microcontroller 34 are pre-loaded into SPROM 38. In preferred embodiments, the default configuration design for on-board FPGA 32 is stored in a first page of SPROM 38, and the default firmware code for microcontroller 34 is stored in a second page of SPROM 38. Storing both the default on-board FPGA configuration and the default microcontroller firmware in a single serial memory, i.e., SPROM 38, is in contrast to conventional interface devices which store microcontroller firmware in a dedicated, byte-wide memory element such as, for instance, EPROM or flash memory. By storing the default firmware code for microcontroller 34 and the default configuration design for on-board FPGA 32 in the same memory, which as mentioned above preferably has a surface area less than 0.395 inches by 0.395 inches, the dedicated firmware EPROM or flash memory is eliminated, thereby advantageously conserving board area on interface device 30.

On-board FPGA 32 may be configured in either a serial mode or a parallel mode, as determined by the logic states of dedicated configuration mode pins 32c, 32d, and 32e. In some embodiments, dedicated logic 31 external to on-board FPGA 32 controls the logic state of on-board FPGA 32's dedicated configuration mode pins. In such embodiments, this external dedicated logic is configured to toggle the configuration mode pins of on-board FPGA 32 in response to a control signal received from on-board FPGA 32. As shown in FIG. 3, these configuration mode pins are controlled by register 31, which is in turn controlled by FPGA 32. Thus, FPGA 32 controls its own configuration mode. When the configuration mode pins are in a first logic state, e.g., logic high, on-board FPGA 32 is in serial configuration mode and looks to SPROM 38 via serial port 32s for its configuration design. Conversely, when the configuration mode pins are in a second logic state, e.g., mixed low and high, on-board FPGA 32 may be in parallel configuration mode, and looks to SRAM 36 via parallel port 32p for its configuration design.

Initially, the configuration mode pins are set to the first logic state, e.g., logic high, so that on-board FPGA 32 reads its default configuration design from SPROM 38.

Figure 4:
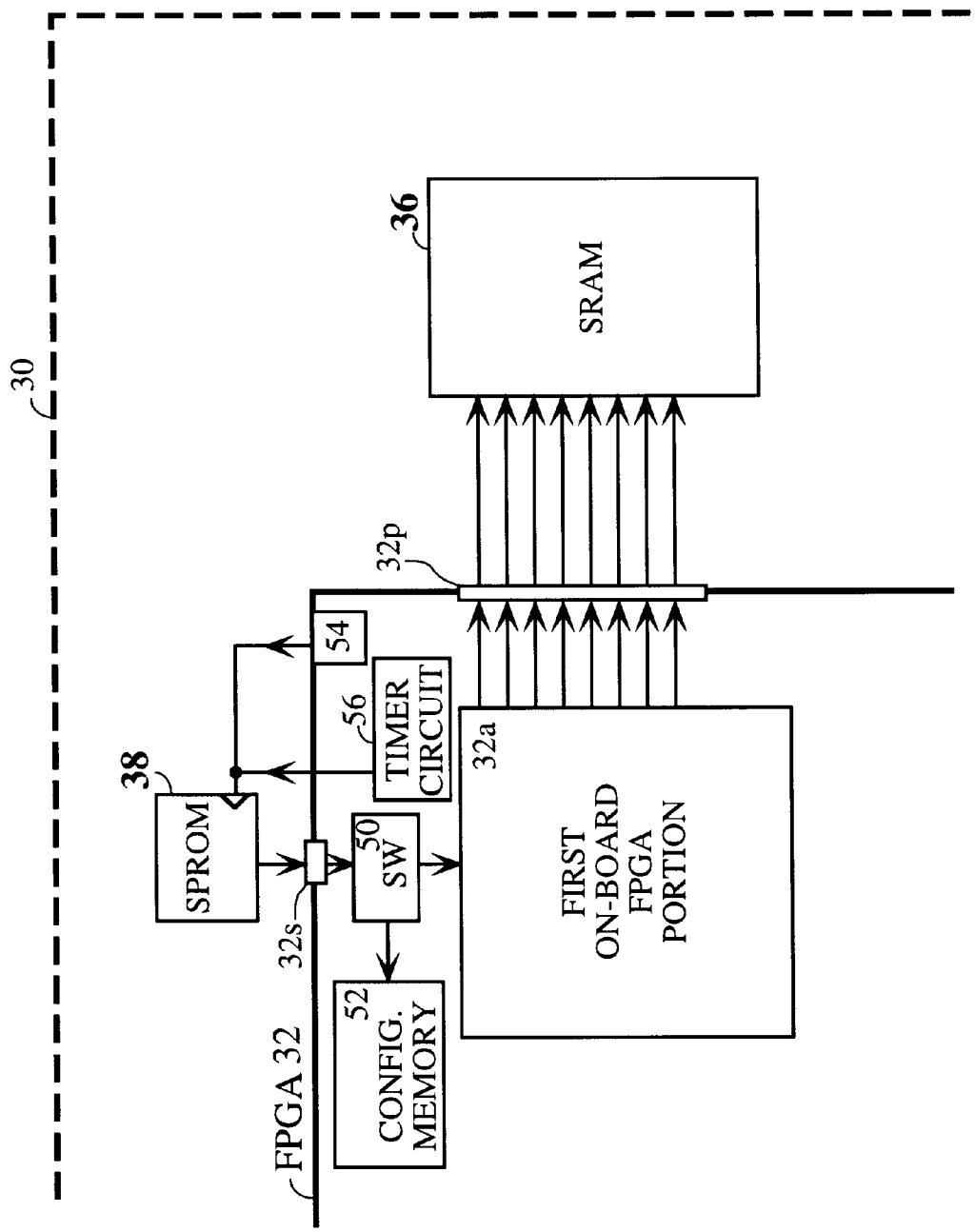
FIG. 4 is a schematic diagram of an on-board FPGA of the interface device of FIG. 3 configured in accordance with present embodiments.
Figure 5:
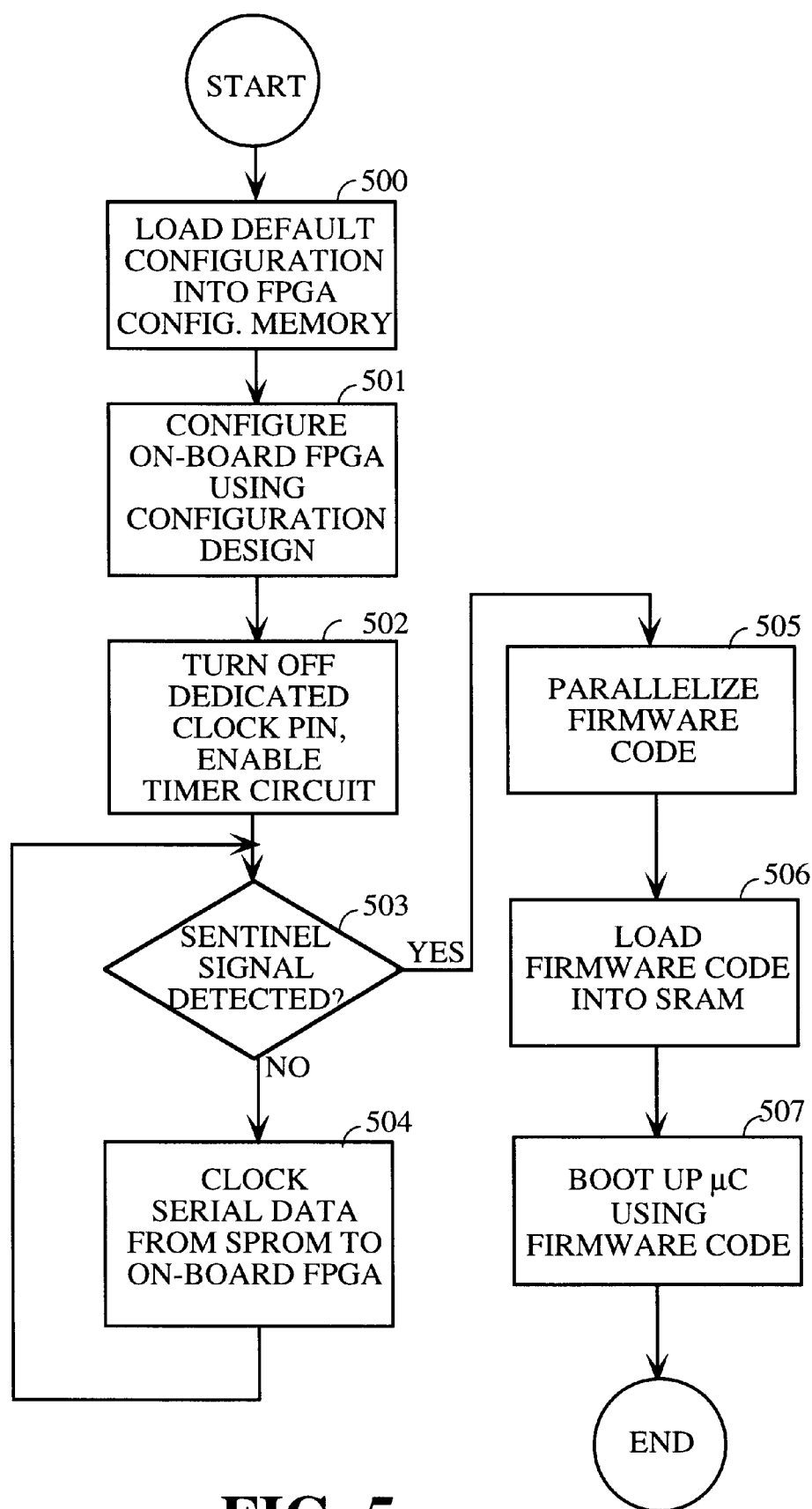
FIG. 5 is a flow chart illustrating configuration of the microcontroller and on-board FPGA of the interface device of FIG. 3 according to present embodiments.

Referring also to FIG. 4 and the flow chart of FIG. 5, upon power-up of interface device 30, on-board FPGA 32 determines that it is in serial configuration mode, and in response thereto, at step 500, begins clocking its default configuration design from SPROM 38 using a clock signal CLK provided by a dedicated clock pin 54. At step 501, on-board FPGA 32 then configures itself to implement functions embodied in its default configuration design by programming its various internal CLBs, IOBs, and PSMs according to the design loaded into configuration memory 52 from SPROM 38. At step 502, after the configuration design is loaded into on-board FPGA 32, on-board FPGA 32 turns its dedicated clock pin 54 off, which in turn stops the clocking of data from SPROM 38. Then, once properly configured in accordance with present embodiments, on-board FPGA 32 enables a timing circuit 56 to drive SPROM 38 with the clock signal CLK. A signal switch 50 within on-board FPGA 32 is initially configured to route the serial configuration data to configuration memory 52 associated with the various CLBs, IOBs, and PSMs within on-board FPGA 32. Timer circuit 56 may be either internal to on-board FPGA 32 or external to on-board FPGA 32. When internal, timing circuit 56 is implemented by appropriately configuring another portion of on-board FPGA 32 to generate the clock signal CLK.

After FPGA 32 is configured with the default configuration, at steps 503 and 504, on-board FPGA 32 monitors the serial data clocked from SPROM 38 for the sentinel signal, which identifies the beginning of the default firmware code for microcontroller 34. When the sentinel signal has been detected, at step 505, switch 50 is reconfigured to route the subsequent firmware code to first on-board FPGA portion 32a which, as mentioned above, parallelizes the serial firmware code so as to be compatible with the byte-wide data pins of SRAM 36. The resultant parallel firmware code is then written to SRAM 36 (step 506) in a byte-wide format, and microcontroller 34 thereafter boots up using the firmware code received from SPROM 38 (step 507). In another embodiment, no SRAM 36 is provided, and FPGA 32 routes the parallelized data to internal RAM within itself.

Figure 6:
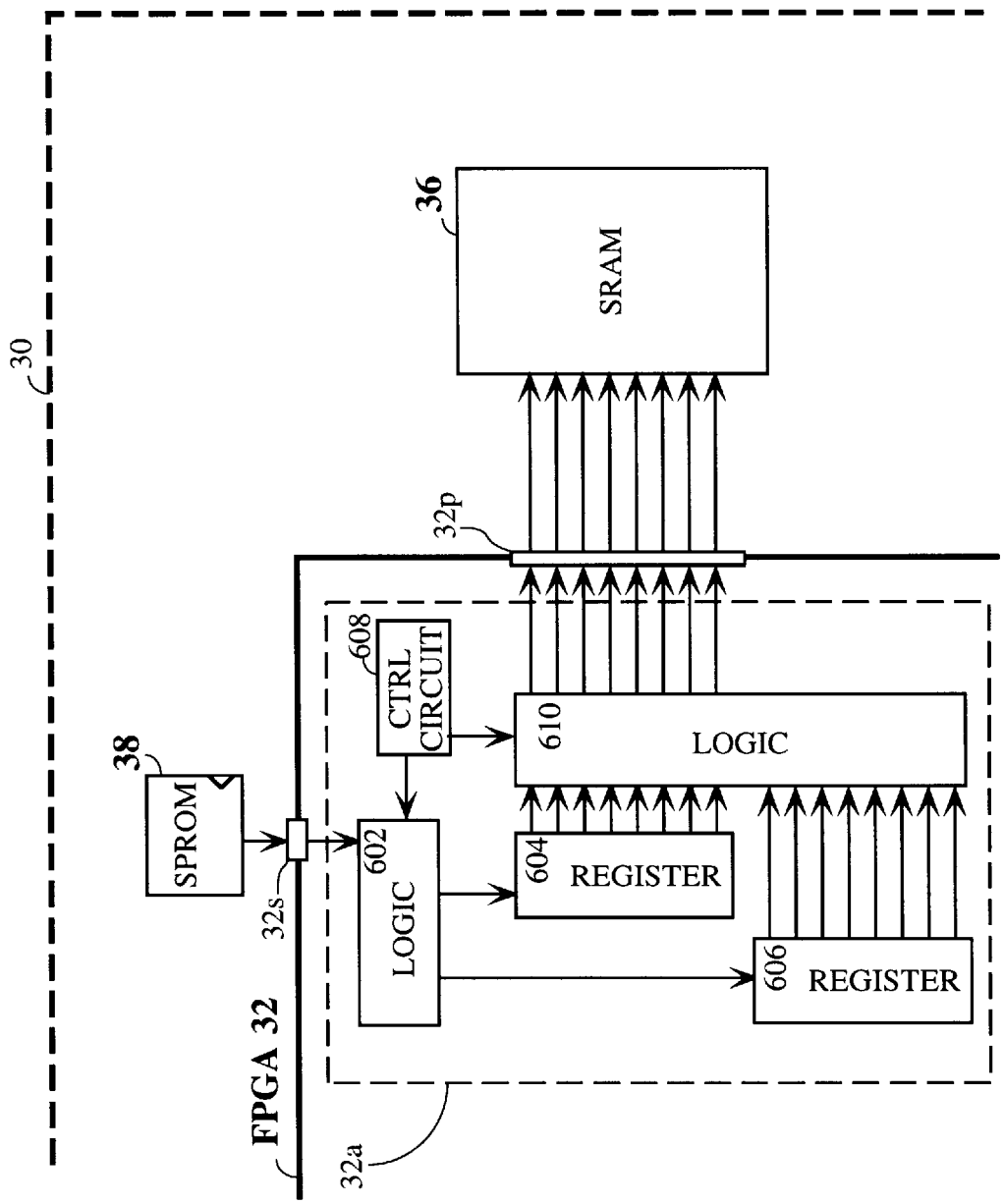
FIG. 6 is a schematic diagram of an independently programmable portion of the on-board FPGA of FIG. 4 configured in accordance with present embodiments.

In preferred embodiments, first on-board FPGA portion 32a includes two byte-wide registers which alternately load serial bytes from SPROM 38 and drive parallel bytes to SRAM 36. FIG. 6 shows an FPGA portion that is in one embodiment the first on-board FPGA portion 32a of FIG. 4.

Here, the default firmware code serially clocked out of SPROM 38 is provided to logic 602 which, in response to control signals CTRL provided by a control circuit 608, alternately routes successive bits of the firmware code into byte registers 604 and 606, which in one embodiment are 8-bit shift registers. The contents of byte registers 604 and 606 are alternately provided in parallel to logic 610 which, in response to control signals CTRL from control circuit 608, alternately forwards bytes of the firmware code received from byte registers 604 and 606 to SRAM 36 via parallel port 32p. Thus, while one byte of the firmware code is read from SPROM 38, another byte is being written to SRAM 36. The use of two registers 604 and 606 in a complementary fashion to alternately load serial data from SPROM 38 and read out parallel data to SRAM 36 increases the speed of parallelizing the microcontroller firmware code. A counter may be used to determine when byte registers 604 and 606 are fully loaded. In some embodiments, the control signals CTRL are provided by the timer circuit 56 (see FIG. 4).

Referring again to FIG. 3, after the default microcontroller firmware is successfully loaded into SRAM 36, on-board FPGA 32 sends a wake up signal to microcontroller 34, which enables its port connection with on-board FPGA 32 and awaits its default firmware code. On-board FPGA 32 accesses SRAM 36, and thereafter routes the default microcontroller firmware code stored in SRAM 36 to microcontroller 34. The firmware code is loaded into microcontroller 34's internal memory, and thereafter used to boot up microcontroller 34. In some embodiments, on-board FPGA 32 wakes up microcontroller 34 by directly toggling microcontroller 34's reset pin.

Present embodiments advantageously allow the configuration of on-board FPGA 32 to be modified in-system from host system 20, without having to power-down interface device 30 or re-program SPROM 38. Being able to change the configuration design of on-board FPGA 32 is desirable, for instance, when using interface device 30 as a configuration conduit for various target FPGAs having different configuration formats.

Figure 7A:
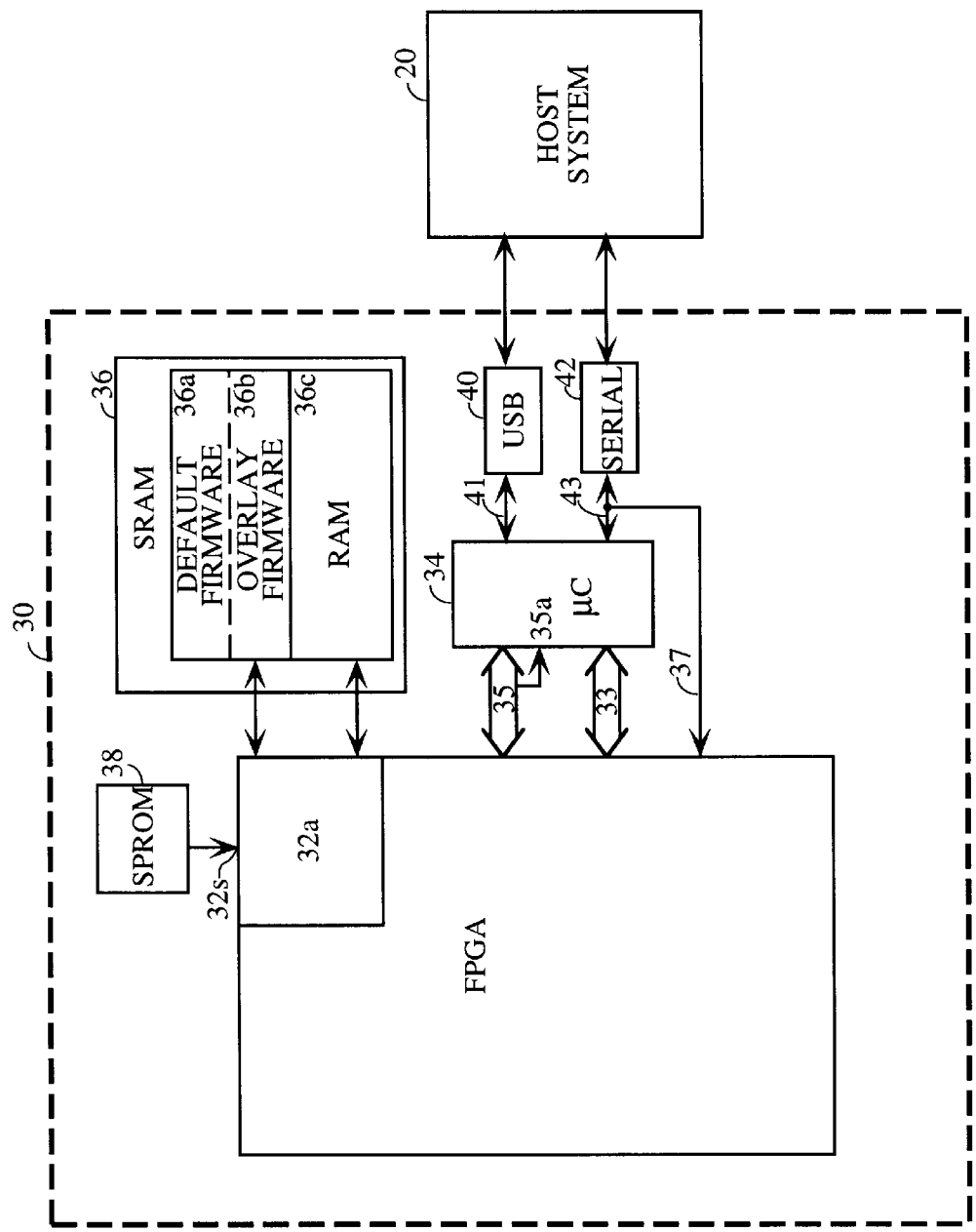
FIG. 7a shows in more detail the organization of SRAM 36 shown in FIG. 3.

In accordance with the present invention, a new on-board FPGA configuration design is downloaded from host system 20 to microcontroller 34 using either USB port 40 or RS-232 port 42, along with a command to reconfigure on-board FPGA 32 in parallel configuration mode. FIG. 7a shows in more detail the memory structure of SRAM 36. Portions 36a and 36b contain default microcontroller firmware code and overlay firmware code, respectively, discussed further below in connection with FIG. 7b. Portion 36c contains RAM, used for storing an alternative FPGA configuration design. Microcontroller 34 routes the new on-board FPGA configuration design to portion 36c of SRAM 36 via on-board FPGA 32, and instructs on-board FPGA 32 to reconfigure itself in parallel configuration mode. In response thereto, microcontroller 34 places itself on stand-by and on-board FPGA 32 toggles its dedicated configuration mode pins 32c, 32d to the second logic state so as to be in parallel configuration mode. The programming pin PROG is toggled in order to begin configuration. On-board FPGA 32 then reads the new configuration design from SRAM 36 via its parallel port 32p, and reconfigures itself accordingly. Once reconfigured with the new configuration design, on-board FPGA 32 wakes up microcontroller 34 by, for instance, toggling interrupt pin 35a of microcontroller 34 via bus 35. Thereafter, microcontroller 34 awaits subsequent commands from host system 20.

As explained above, present embodiments use serial port 32s of on-board FPGA 32 for reading the default configuration design from SPROM 38, and use parallel port 32p of on-board FPGA 32 for reading new configuration designs from SRAM 36. In this manner, on-board FPGA 32 can be reconfigured without powering down interface device 30, thereby advantageously allowing interface device 30 to be easily adapted to perform additional functions on the target FPGAs beyond simply configuring and testing the FPGAs. Note that the target need not be a single FPGA device but may be several FPGAs, several CPLDs, or a combination of FPGAs, CPLDs and other in-system-programmable devices. A CPLD (complex programmagle logic device) includes a plurality of AND/OR structures interconnected by a programmable routing structure. Further, by using parallel port 32p to read new configuration designs from SRAM 36, present embodiments are able to retain the default on-board FPGA configuration design in SPROM 38, thereby allowing on-board FPGA 32 to re-boot itself using the default configuration design at any time.

During the reconfiguration process, FPGA 32 places itself into a tristate mode, so that contention will not occur while configuration is in an intermediate state. Usually an outside device applies a control signal to a programming pin PROG (FIG. 3) to initiate the configuration process. In one embodiment of the invention, a small one-shot device 39 is provided for this reconfiguration function. When FPGA 32 receives a signal that it is to be reconfigured, FPGA 32 applies an activation signal to one-shot 39, causing one-shot 39 to hold FPGA 32 in programming mode for a specified period of time and then releasing FPGA 32 to begin reconfiguration. As is well known, one-shot devices are available with a variety of delay times.

Using both the parallel and serial ports of on-board FPGA 32 for reading configuration designs in the manner described above with respect to FIG. 3 is in marked contrast to conventional interface devices which use only one of the on-board FPGA ports for configuration purposes. In those conventional interface devices, any new configuration designs for the device's on-board FPGA are typically written to the same memory which stores the default on-board FPGA configuration, and are sometimes written over the default configuration. Here, present embodiments not only allow for simultaneous storage of both a default on-board FPGA configuration and a new on-board FPGA configuration, but also allow on-board FPGA 32 to reconfigure itself at any time using either configuration.

It may later become desirable to modify the default firmware code for microcontroller 34. For example, a software bug may be discovered within the firmware code, or a newer version of the firmware code may be available for download from host system 20. Present embodiments advantageously allow the default microcontroller firmware to be updated or selectively replaced with new firmware code without having to manually power-down and re-boot interface device 30, and without having to replace or re-program SPROM 38.

As mentioned above, upon initial power-up of interface device 30, on-board FPGA 32 parallelizes the default microcontroller firmware code received serially from SPROM 38 and provides it in byte-wide format to SRAM 36, from which it may be accessed by microcontroller 34 via on-board FPGA 32.

Figure 7B:
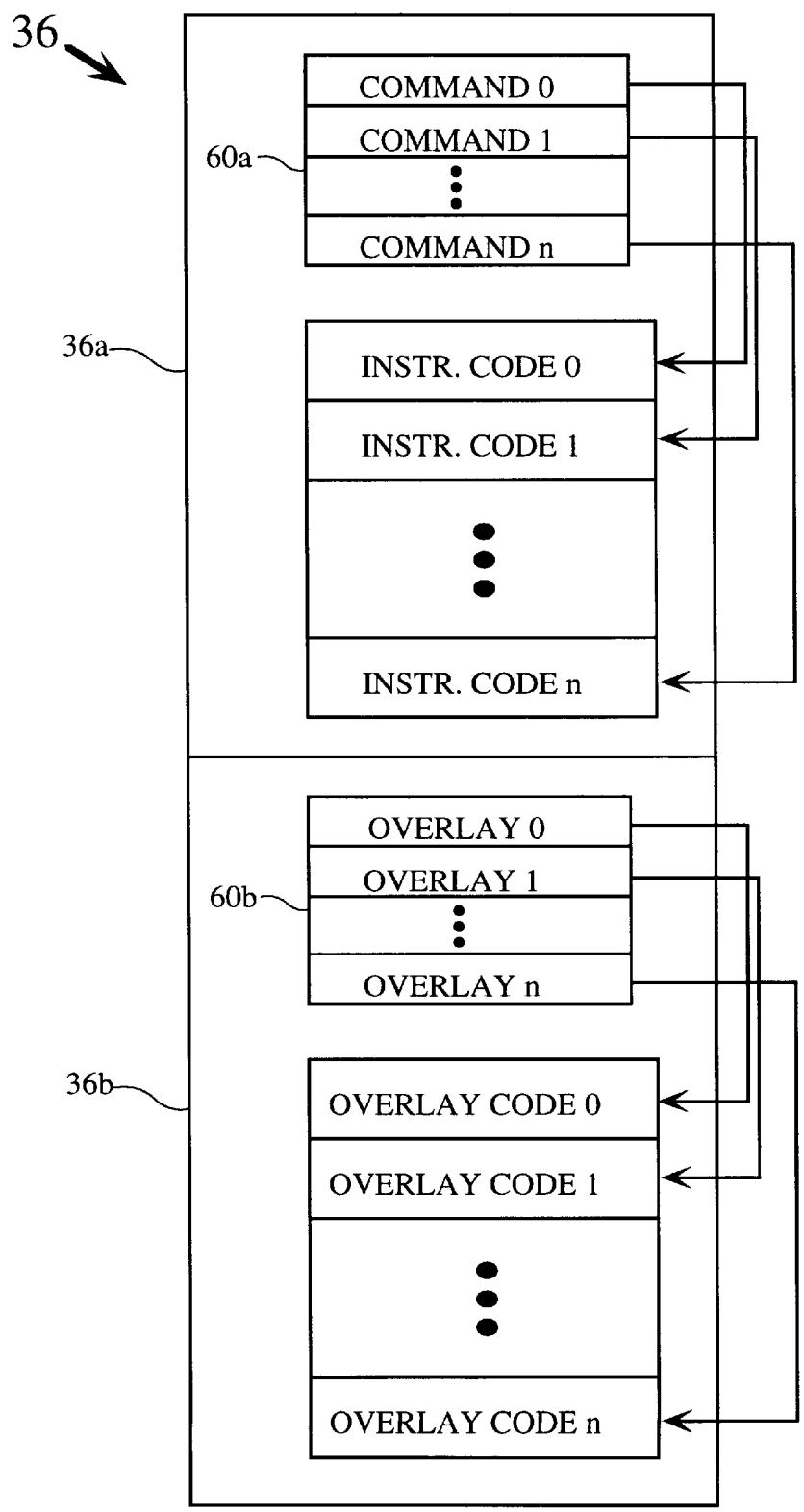
FIG. 7b is a schematic diagram of an SRAM organization of microcontroller firmware code used in accordance with present embodiments.

In accordance with present embodiments, SRAM 36 stores microcontroller firmware in an upper page 36a and a lower page 36b, as illustrated in FIGS. 7a and 7b, where upper page 36a and lower page 36b have associated look-up tables 60a and 60b, respectively. The default firmware code received from SPROM 38 upon initial power-up is written into upper SRAM page 36*a*. When it is desired to replace selected portions of the firmware code with a new overlay code, the new overlay code is downloaded from host system 20 via microcontroller 34 and then written into lower SRAM page 36*b*. Once the new overlay code is successfully loaded into lower SRAM page 36*b*, microcontroller 34 sets one or more internal overlay flags indicating that one or more sections of overlay code have been successfully written to lower SRAM page 36*b*.

Thereafter, when a command is received from host system 20, microcontroller 34 first determines whether any overlay code has been downloaded from host system 20 by sensing its internal overlay flag. If the overlay flag is asserted, microcontroller 34 first searches lower SRAM page 36*b* for corresponding instruction code and, if there is a match, executes the received command using the corresponding overlay instruction code. If there is not a match within lower SRAM page 36*b*, microcontroller 34 then searches upper page 36*a* for the corresponding firmware code, and thereafter executes the received command using the default firmware code. In this manner, a user can easily modify or replace selected portions of the default firmware code from host system 20 without having to re-program SPROM 38 or re-boot microcontroller 34. In addition, the default firmware code is advantageously maintained in the upper SRAM page 36*a*, as well as permanently stored in SPROM 38, thereby allowing microcontroller 34 to operate according to its default firmware code at any time by simply resetting the overlay flags.

Figure 8:
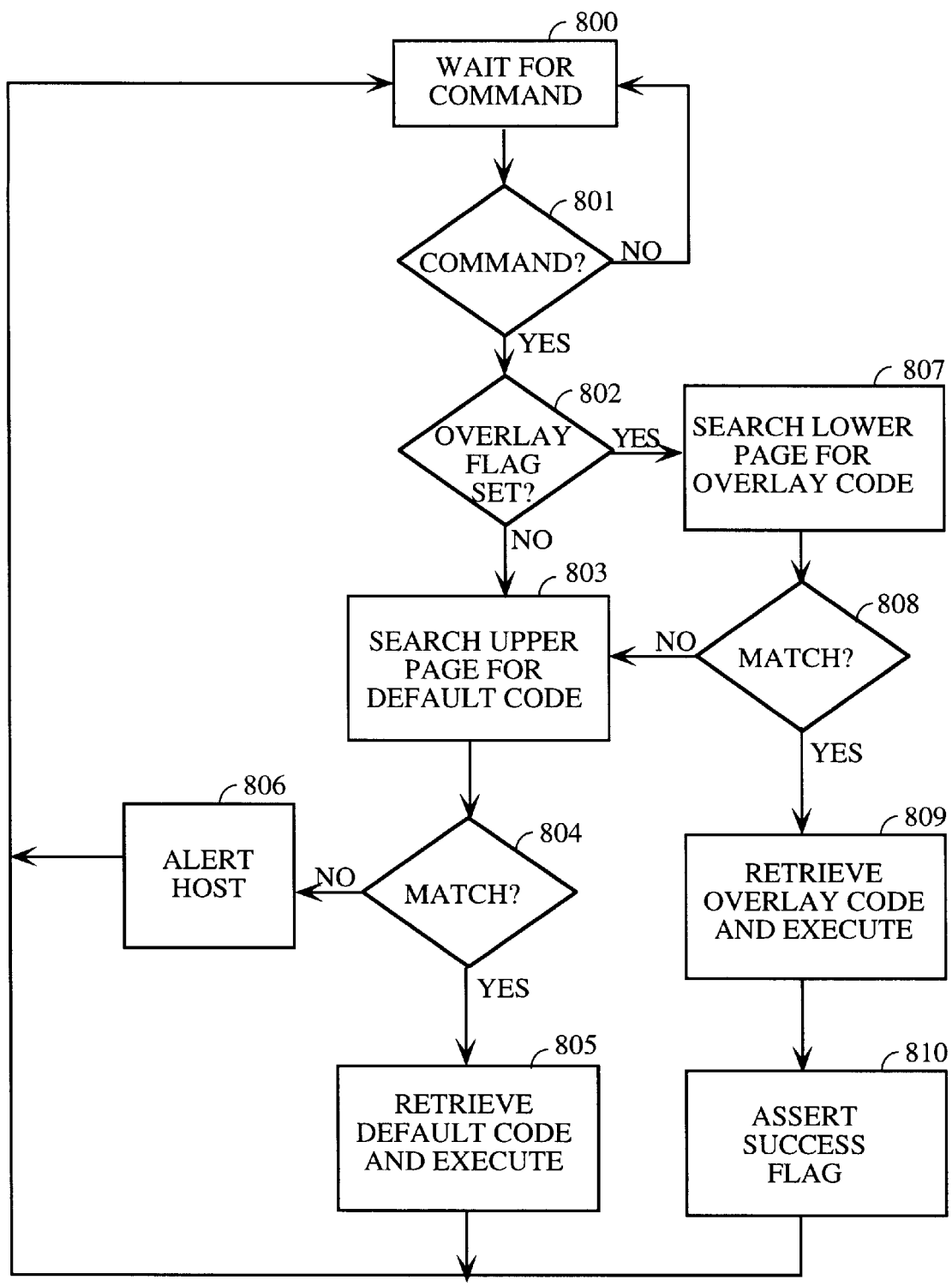
FIG. 8 is a flow chart illustrating reconfiguration of microcontroller firmware code in accordance with present embodiments.

Substituting overlay code for default code can be initiated by setting a single flag indicating that some overlay code exists and checking on whether overlay code has been provided for a particular command, or it can be initiated by setting flags for each command having overlay code. The following description assumes there is a single flag. Referring to the flow chart of FIG. 8, after microcontroller 34 boots up using the default firmware code in upper SRAM page 36*a*, microcontroller 34 waits for a command from host system 20 (step 800). When a command is received from host system 20 (step 801), microcontroller 34 first determines whether the overlay flag is asserted (step 802). If the overlay flag is not asserted, microcontroller 34 searches upper look-up table 60*a* associated with upper SRAM page 36*a* for a matching firmware command (step 803). Each firmware command stored in look-up table 60*a* points to a start address in upper SRAM page 36*a* where firmware instruction code corresponding to that command is located. If there is a match (step 804), microcontroller 34 retrieves the corresponding default instruction code from upper SRAM page 36*a*, executes the command received from host system 20 in accordance with the retrieved instruction code (step 805), and then waits for the next command (step 800). If a match is not found in upper look-up table 60*a*, microcontroller 34 alerts host system 20 that the command could not be executed (step 806), and then waits for the next command (step 800).

If microcontroller 34 determines that the overlay flag is asserted (step 802), thereby indicating that new firmware code is successfully loaded into lower SRAM page 36*b*, microcontroller 34 changes the page of execution code to lower SRAM page 36*b*, and then compares the command received from host system 20 to overlay commands loaded within lower look-up table 60*b* associated with lower SRAM page 36*b* (step 807). Overlay commands stored in lower look-up table 60*b* point to start addresses in lower SRAM page 36*b* where the corresponding overlay instruction codes are located. If a match is found in lower look-up table 60*b* (step 808), microcontroller 34 retrieves the corresponding overlay instruction code from lower SRAM page 36*b* (step 809), and executes the command received from host system 20 in accordance with the retrieved overlay instruction code. Microcontroller 34 then sets a success flag (step 810) to indicate that the command has been executed according to the overlay code, thereby alerting the default code not to execute the command. Microcontroller 34 then waits for the next command (step 800).

If a match is not found in lower look-up table 60*b* (step 808), thereby indicating that there is no overlay code which corresponds to the received command, microcontroller 34 changes the page of execution code to upper SRAM page 36*a*, and searches upper look-up table 60*a* for a matching firmware command (step 803). Then, microcontroller 34 executes the received command using the default code as described above with respect to steps 804, 805, and 806.

Present embodiments also allow host system 20 to communicate with microcontroller 34 over the RS-232 serial port even when microcontroller 34 is not responsive to commands from host system 20 such as, for instance, when microcontroller 34 freezes or is servicing a long download file from host system 20. In accordance with the present invention, host system 20 sends a null character having a baud rate which is not normally used for communications between host system 20 and interface device 30 to instruct on-board FPGA 32 to perform some predetermined function, where one or more predetermined functions are defined by the baud rate of the null character. A second portion 32*b* of on-board FPGA 32 is configured to monitor the data line of RS-232 port 40 via line 37 for null characters sent from host system 20 at these predetermined baud rates not normally used by host system 20. When such a null character is detected by on-board FPGA portion 32*b*, on-board FPGA 32 instructs microcontroller 34 to perform one of several predetermined functions, depending upon the baud rate of the null character. In this manner, present embodiments use on-board FPGA 32 to relay commands from host system 20 to microcontroller 34 where direct communication between host system 20 and microcontroller 34 is not working.

Figure 9:
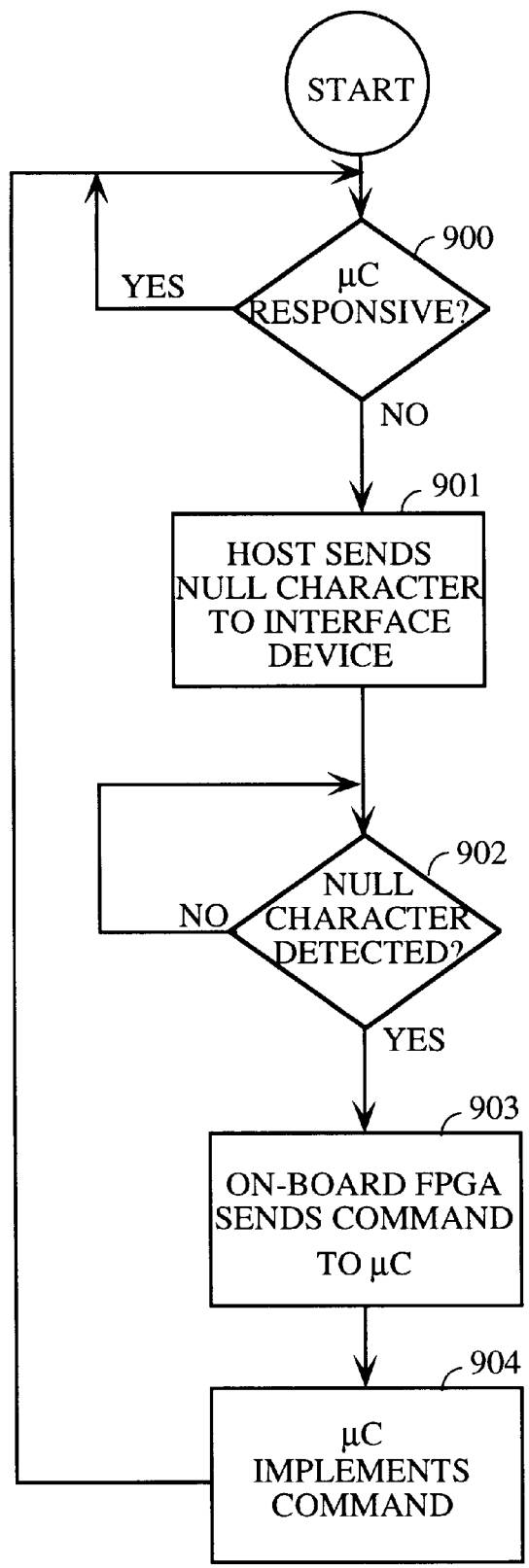
FIG. 9 is a flow chart illustrating communication with the interface device of FIG. 3 via the on-board FPGA according to present embodiments.

Typical valid baud rates over RS-232 serial port 42 are 9600, 19200, 38400, and 57600. The default baud rate is 9600, which corresponds to data characters requiring 83 microseconds per byte. As illustrated in FIG. 9, where microcontroller 34 is no longer responsive to commands from host system 20 (step 900), host system 20 sends a null character (one hexadecimal byte) to interface device 30 at 300 baud to instruct on-board FPGA 32 to reset microcontroller 34 (step 901). A byte of null characters sent at 300 baud requires 2.666 milliseconds. Thus, when on-board FPGA portion 32*b* detects a logic low data signal on RS-232 serial port 42 for a time greater than about 2.5 milliseconds, on-board FPGA 32 issues a command (step 903) to microcontroller 34, for example a hardware reset of microcontroller 34 by, for instance, toggling microcontroller 34's reset pin. In response thereto, (step 904) microcontroller 34 implements the command, for example re-boots itself using the default firmware code loaded in upper SRAM 36 as described above, and is thereafter able to communicate with host system 20.

Sending a null character is also useful when negotiating the highest possible baud rate between host system 20 and interface device 30. Here, host system 20 initially communicates with microcontroller 34 at 9600 baud and, if successful, instructs microcontroller 34 to increase the baud rate of its UART to the next highest rate, e.g., 19200 baud.

Host system 20 attempts to communicate with microcontroller 34 at this higher baud rate and, if successful, again instructs microcontroller 34 to increase the UART baud rate to the next highest baud rate. This process continues until the maximum baud rate of the UART of microcontroller 34 or the UART of the host is exceeded, at which point host system 20 is no longer able to communicate with microcontroller 34. Here, host system 20 sends a null character at 300 baud to reset microcontroller 34 via on-board FPGA 32 and, after microcontroller 34 re-boots itself, then instructs microcontroller 34 (at a baud rate of 9600) to change its baud rate to the last successful baud rate.

Host system 20 is able to relay other commands to microcontroller 34 via on-board FPGA 32 by sending null characters at other baud rates. For example, where a user operating host system 20 desires to abort a download from host system 20 to interface device 30, host system 20 sends a null character (one hexadecimal byte) at 600 baud to instruct on-board FPGA 32 to send an interrupt command to microcontroller 34. A byte sent at 600 baud has a pulse width of 1.333 milliseconds. Thus, when portion 32b of on-board FPGA senses a logic low data signal for a period of time between 1 and 1.5 milliseconds, on-board FPGA 32 sends an interrupt signal to microcontroller 34 by, for instance, toggling microcontroller 34's interrupt pin 35a.

The specific null character baud rates mentioned above for resetting and interrupting microcontroller 34, e.g., 300 and 600 baud, are arbitrary, and thus may be of any suitable baud rate which is significantly distinguishable from the baud rates normally used over serial port 42. The specific null character baud rates are preferably less than 9600 baud. In other embodiments, a conventional timer is used to detect null characters sent by host system 20.

As mentioned above with respect to FIG. 3, interface device 30 is configured to receive its supply voltage and ground potential reference via flying wires 44a and 44b, respectively, from external voltage supply 11, which in some embodiments is included within target FPGA 10. Converter circuit 45 provides the 5 volt plane for powering microcontroller 34, and provides the 3.3 volt plane for powering on-board FPGA 32, other logic circuits, and peripheral circuits (not shown for simplicity).

Low power detection circuit 46 is coupled to monitor the 5-volt plane generated by converter circuit 45, and has an output terminal coupled to microcontroller 34 via signal line 47. Initially, low power detection circuit 46 maintains line 47 at ground potential. Low power detection circuit 46 includes a comparator, resistor network, or other suitable logic which drives signal line 47 to logic high when the voltage on the 5 volt plane falls below a predetermined threshold voltage. In response to the logic high signal on line 47, microcontroller 34 sends to host system 20 a low power flag which notifies host system 20 that the 5 volt plane on interface device 30 has fallen below the predetermined threshold. In response thereto, host system 20 may take appropriate action, such as, for example, alerting the user to the low power condition and/or resetting interface device 30.

In one embodiment in which microcontroller 34 is operational as long as the 5 volt plane stays above approximately 4.3 volts, the predetermined threshold voltage is set to approximately 4.7 volts so as to give microcontroller 34 time to alert host system 20 of the low power condition. The typical RC time constant associated with the 0.4 volt cushion between the predetermined threshold voltage and the minimum operational voltage for microcontroller 34 allows microcontroller 34 sufficient time to send the low power flag to host system 20. In some embodiments, low power detection circuit 46 is implemented within converter circuit 45. In others, low power detection circuit 46 is implemented within FPGA 32.

Preferably, microcontroller 34 sends the low power flag to host system 20 using USB port 40. Here, a special register within host system 20 (not shown) stores the logic state of the low power flag where, for instance, a logic zero indicates that the low power flag is not asserted and a logic one indicates that the low power flag is asserted. In accordance with present embodiments, when detection circuit 46 senses that the voltage on the 5 volt power plane drops below the predetermined threshold voltage, microcontroller 34 asserts the low power flag by sending a logic high data packet to host system 20 over USB port 40. This logic high data packet has a USB endpoint which identifies the above-mentioned special register within host system 20 so that when received by host system 20, the logic high data packet is routed to and loaded into host system 20's special register.

Here, host system 20 is configured to determine the value stored in its special register before sending a command to interface device 30, and in some embodiments is configured to look to the special register in response to any downloading errors reported to host system 20 via USB handshaking. Accordingly, if host system 20 senses a logic one stored in the special register, host system 20 immediately alerts the user that a low power condition exists on interface device 30, and in some embodiments is configured to automatically reset interface device 30 in response to the low power condition. Host system 20 then resets the special register.

Although the low power flag may be sent to host system 20 over RS-232 serial port 42, USB port 40 is preferred since USB standards allow the low power flag to be sent to host system 20 immediately after being reported by detection circuit 46. Applicants have found that present embodiments are able to notify host system 20 of a low power condition via USB port 40 within a few microseconds, which allows host system 20 up to several milliseconds to take appropriate action before power to interface device 30 is lost.

Present embodiments also achieve increased compatibility with a variety of target devices by allowing the maximum voltage level of logic signals of interface device 30 to be converted so as to be compatible with a target device employing logic signals having a lower maximum voltage level. For instance, in one embodiment, interface device 30 employs a 3.3 volt logic level, that is, a signal line pulled to the 3.3 volt supply indicates a logic one, and a grounded signal line indicates a logic zero. If target FPGA 10 is a 3.3 volt device, the 3.3 volt logic signals of interface device 30 are compatible with target device 10 and no adjustment is needed. If, on the other hand, target FPGA 10 is a 2.5 volt device, the 3.3 volt logic levels are stepped down to approximately 2.5 volt logic levels to prevent damage to target FPGA 10.

Referring to FIG. 10, each output signal line OUT of on-board FPGA 32 is coupled to an input terminal of a de-multiplexer 72 which, in turn, has two output terminals coupled to respective on-board FPGA output pins OUT_A and OUT_B. The control terminal of de-multiplexer 72 is coupled to a register 74. A conventional switch 76 has an input terminal coupled to output terminal OUT_A of on-board FPGA 32, and is controlled by a control terminal coupled to register 74. This switch 76 has its output terminal coupled to output pin 78 of interface device 30, which in turn is coupled to target FPGA 10 via a flying wire 80. On-board FPGA output terminal OUT_B is coupled directly to output pin 78. In preferred embodiments, switch 76 is an 8-input quick switch available from Quality Semiconductor, of Santa Clara, Calif., and provides a voltage drop of approximately 1 volt, although in other embodiments switch 76 is an MOS transistor within FPGA 32 having a drain-to-source voltage of approximately 1 volt.

Microcontroller 34 writes to register 74 a control bit having a logic value indicative of whether target FPGA 10 is a 3.3 volt or 2.5 volt device. For example, if target FPGA 10 is a 3.3 volt device, microcontroller 34 writes a logic zero to register 72 and, conversely, if target FPGA 10 is a 2.5 volt device, microcontroller 34 writes a logic one to register 74. If the control bit in register 74 is logic zero, de-multiplexer 72 passes data signals from on-board FPGA output line OUT to output pin OUT_B and turns off switch 76. Thus, 3.3 volt logic high signals are provided from on-board FPGA 32 to target FPGA 10. Conversely, if the control bit in register 74 is logic one, de-multiplexer 72 passes data signals from on-board FPGA output line OUT to output pin OUT_A and turns on switch 76. In this case, 3.3 volt logic high signals from on-board FPGA 32 pass through switch 76 which, as mentioned above, effects a voltage drop of approximately 1 volt. Thus, the 3.3 volt logic signal is stepped down to approximately 2.3 volts before being provided to target FPGA 10. In this manner, 2.5 volt target devices are not driven with 3.3 volt logic high signals which, as mentioned above, may otherwise damage the target device.

Note that specific voltages mentioned in the above example with respect to FIG. 10 are illustrative only; present embodiments may employ logic signals other than 3.3 volt signals, and may convert to any desired target voltage level. For instance, in some embodiments interface device 30 may employ 3.3 volt logic signals and, if necessary, convert the 3.3 volt logic signals to 1.8 volt logic levels. The voltage drop across switch 76 may be adjusted as desired by, for instance, providing additional switches in series with switch 76.

According to another aspect of the invention, interface device 30 is configured to disguise its connection to the USB port of host system 20 until interface device 30 is properly configured. According to the Universal Serial Bus Specification, Revision 1.0, a host computer that will connect to a USB uses two data lines, each having pull-down resistors attached with resistances of 15 kΩ±5%. These are weak pull-down resistors and assure that the two data lines will have logic 0 levels when there is no device attached to the USB port of the host computer. A peripheral device attached to this USB port must have a pull-up resistor with resistance of 1.5 kΩ±5% attached to one of the two data lines. Thus, when a device is attached to the USB port, the host computer will detect a high voltage on one line (the low-resistance pull-up resistor in the peripheral device will override the host's pull-down resistor). The host detects a "connect" condition when one of the data lines is pulled high for more than 2.5 µs. In response to this combination of voltages, the host expects a sequence of identifying signals from the peripheral device. If the peripheral device does not identify itself within the required time, the host closes its USB port and the peripheral device is thereafter not able to communicate with the host.

In accordance with the invention, a pullup resistor in interface device 30, which the USB Bus Specification requires for peripheral devices, is connected through a switch to the positive voltage supply. When interface device 30 is first connected to host system 20, this switch is turned off, so that host 20 does not detect a high signal indicating the presence of interface device 30. Only after FPGA 32 is configured by SPROM 38, and default microcontroller firmware code is loaded into SRAM 36, is this switch turned on so that host 20 can recognize the presence of interface device 30 and interface device 30 can identify itself.

Referring to FIG. 11, microcontroller 34 is coupled to data pins P2 and P3 of USB interface 40 via signal lines 92 and 93, respectively. A switch 90 having a control terminal coupled to receive a disable signal from microcontroller 34 via a line 91 is coupled between resistor R and interface device 30's supply voltage $V_{DD}$. Resistor R is coupled to signal line 93. Microcontroller 34 turns off switch 90 immediately after power is supplied to interface device 30, thereby isolating signal line 93 and thus USB data pin P3 from $V_{DD}$. Isolating USB pin P3 from $V_{DD}$ prevents host system 20 from detecting interface device 30's USB connection. Meanwhile, on-board FPGA 32 configures itself using the default configuration design stored in SPROM 38, as described above with respect to FIG. 3. Once configured, on-board FPGA 32 parallelizes the default firmware code read from SPROM 38, and loads the resulting parallel firmware code into SRAM 36. Microcontroller 34 then accesses the firmware code from SRAM 36 via on-board FPGA 32. Once booted up, microcontroller 34 turns on switch 90, making the $V_{DD}$ connection through resistor R to pin P3, pulling up pin P3, and thereby allows host system 20 to detect interface device 30's USB connection. In response thereto, microcontroller 34 provides host system 20 with suitable identification codes such as, for instance, the device and/or manufacturer IDs, operating parameters, etc. within the prescribed time period. In response to the identification code provided by interface device 30, host system 20 loads suitable drivers to facilitate communication with interface device 30.

While particular embodiments of the present invention have been shown and described, it will be obvious to those skilled in the art that changes and modifications may be made without departing from this invention in its broader aspects and, therefore, the appended claims encompass within their scope all such changes and modifications as fall within the true spirit and scope of this invention.

What is claimed is:

1. A method of reconfiguring an FPGA interface device including a microcontroller and an on-board FPGA having a serial data port coupled to a non-volatile memory and a parallel data port coupled to a volatile memory, the method comprising the steps of:

storing a default configuration design for the on-board FPGA in the non-volatile memory;

booting up the FPGA interface device, whereby the on-board FPGA is in a serial configuration mode such that the on-board FPGA is configured using the default configuration design;

downloading a new configuration design to the interface device via the microcontroller;

storing the new configuration design in the volatile memory; and reconfiguring the on-board FPGA using the new configuration design read from the volatile memory via the parallel port.

2. The method of claim 1, wherein the non-volatile memory comprises a serial PROM.

3. The method of claim 1, wherein the volatile memory comprises an SRAM.

4. The method of claim 1, wherein the reconfiguring step comprises the steps of:

switching the on-board FPGA to a parallel configuration mode;

reading the new configuration design from the parallel port, rather than reading the default configuration design from the serial port, in response to the switching step; and reconfiguring the on-board FPGA according to the new configuration design.

5. The method of claim 4, wherein the switching step further comprises toggling a configuration mode pin of the on-board FPGA.

6. The method of claim 5, wherein the on-board FPGA toggles its configuration mode pin.

* * * * *